(12) United States Patent
Sugimoto

(10) Patent No.: US 8,063,400 B2
(45) Date of Patent: Nov. 22, 2011

(54) LIGHT-EMITTING APPARATUS

(75) Inventor: Akira Sugimoto, Saitama (JP)

(73) Assignee: Pioneer Corporation, Tokyo (JP)

( * ) Notice: Subject to any disclaimer, the term of this patent is extended or adjusted under 35 U.S.C. 154(b) by 179 days.

(21) Appl. No.: 12/450,472

(22) PCT Filed: Mar. 28, 2008

(86) PCT No.: PCT/JP2008/056079
§ 371 (c)(1),
(2), (4) Date: Sep. 28, 2009

(87) PCT Pub. No.: WO2008/123416
PCT Pub. Date: Oct. 16, 2008

(65) Prior Publication Data
US 2010/0065832 A1    Mar. 18, 2010

(30) Foreign Application Priority Data
Mar. 30, 2007    (WO) .................. PCT/JP2007/057091

(51) Int. Cl.
H01L 35/24    (2006.01)
H01L 27/15    (2006.01)
H01L 31/12    (2006.01)
H01L 33/00    (2006.01)
H01L 51/00    (2006.01)

(52) U.S. Cl. ................. 257/40; 257/79; 257/88; 257/95

(58) Field of Classification Search ..................... 257/40, 257/98, 99, 100, 101, 88, 86, 89, 93, 79, 257/95
See application file for complete search history.

(56) References Cited

U.S. PATENT DOCUMENTS

| | | |
|---|---|---|
| 2002/0011784 A1 | 1/2002 | Suzuki et al. |
| 2004/0012342 A1* | 1/2004 | Suzuki et al. ............... 315/169.3 |
| 2006/0205311 A1* | 9/2006 | Green et al. .................... 445/24 |

FOREIGN PATENT DOCUMENTS

| | | |
|---|---|---|
| EP | 1 146 565 | 10/2001 |
| JP | 10-111517 | 4/1998 |
| JP | 2001-296814 | 10/2001 |
| JP | 2002-14366 | 1/2002 |
| JP | 2002-297066 | 10/2002 |
| JP | 2003-75864 | 3/2003 |
| JP | 2003-323140 | 11/2003 |
| KR | 10-2007-0085178 | 8/2007 |

OTHER PUBLICATIONS

International Search Report issued Jun. 17, 2008 in International (PCT) Application No. PCT/2008/056079.

* cited by examiner

*Primary Examiner* — Chuong A. Luu
(74) *Attorney, Agent, or Firm* — Wenderoth, Lind & Ponack, L.L.P.

(57) ABSTRACT

A plurality of light-emitting panel units in a large-area light-emitting apparatus are arranged to make joints between the light-emitting panel units unobtrusive. A display panel unit includes a flexible substrate having a flat portion having an extended portion formed on each side thereof, a light-emitting portion formed on one surface of the substrate to extend to the extended portion, and an electrode terminal formed at an end portion of the extended portion of the substrate. The extended portion of the substrate is curved together with the light-emitting portion to connect the light-emitting portions of adjacent light-emitting panel units.

18 Claims, 10 Drawing Sheets

(a)

(b)

FIG.1
(a)
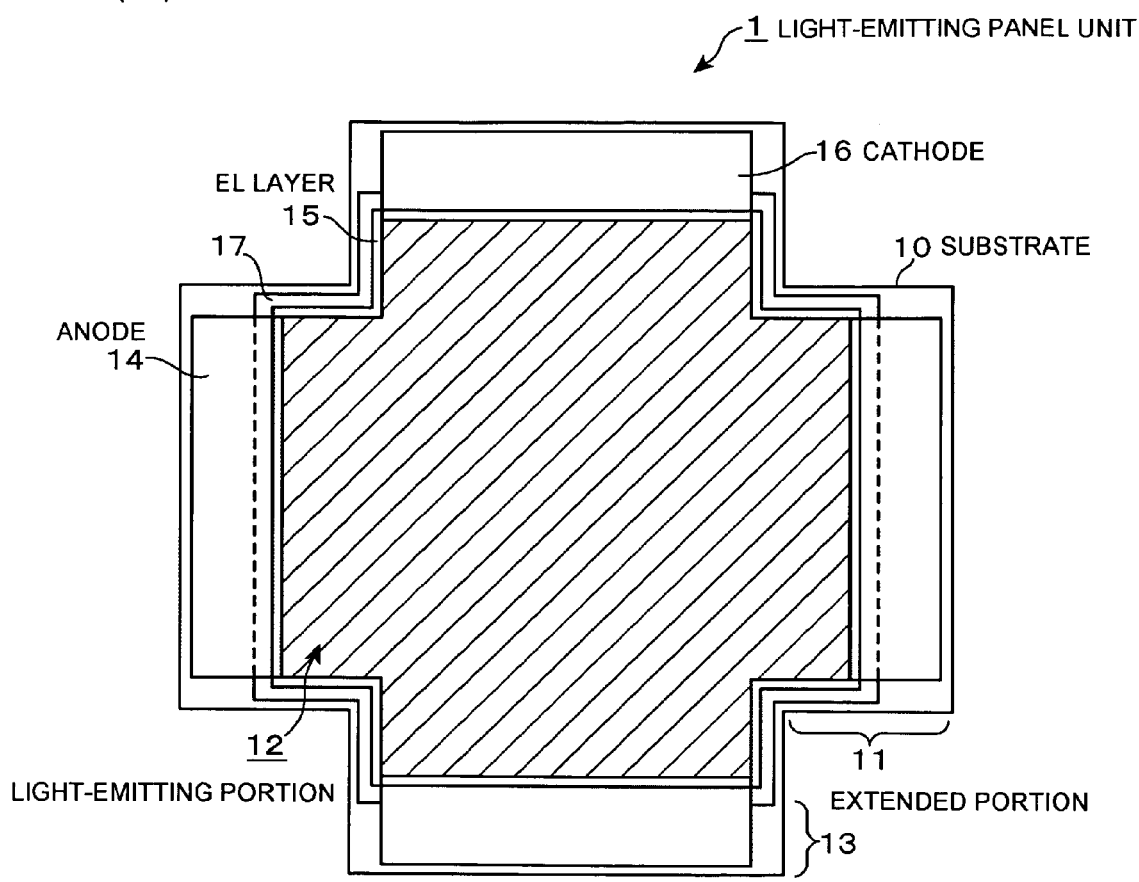
(b)

FIG.2
(a)
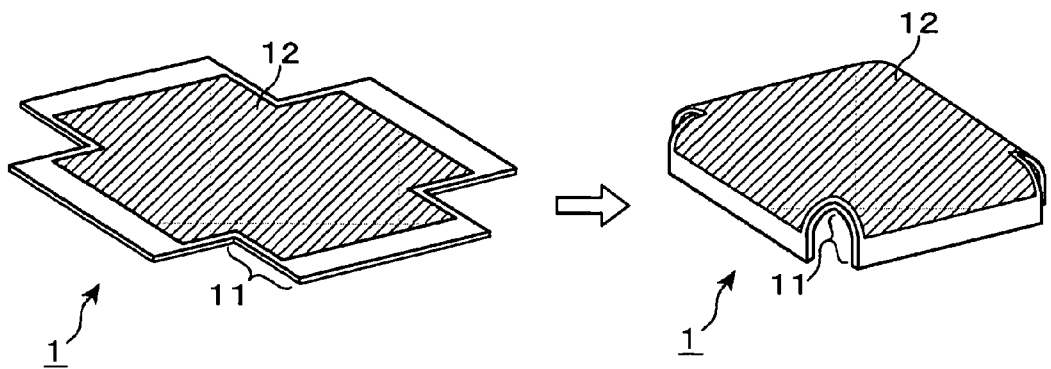
(b)
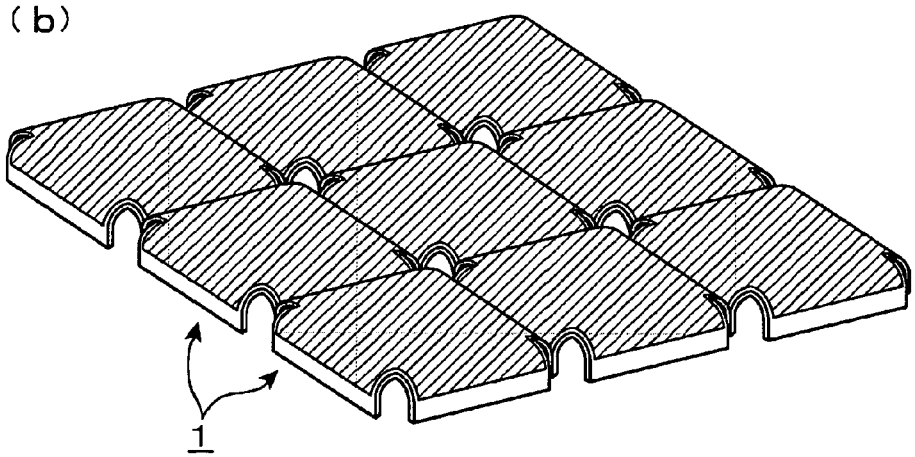
FIG.3
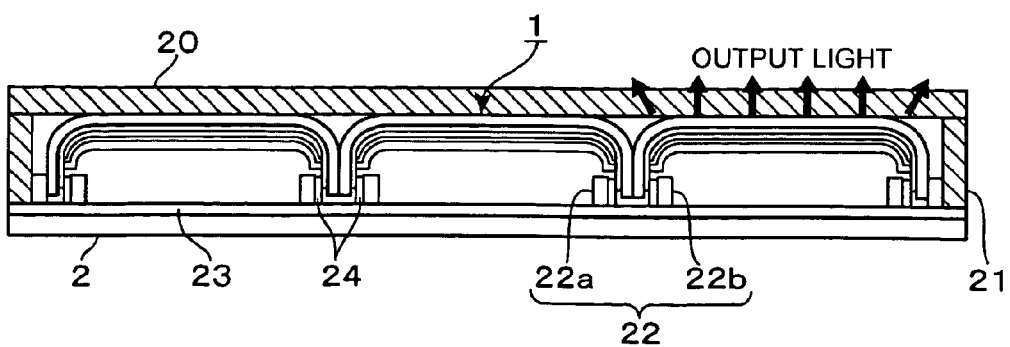

3 X 3 ARRANGEMENT

24 X 24 ARRANGEMENT

1

FIG.7
(a)
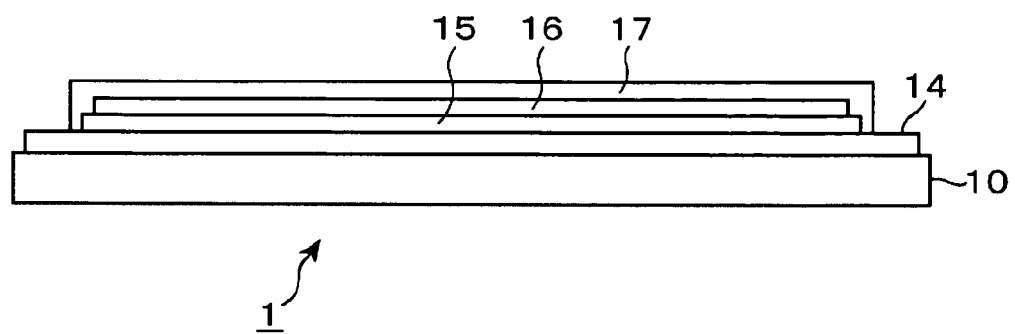
(b)
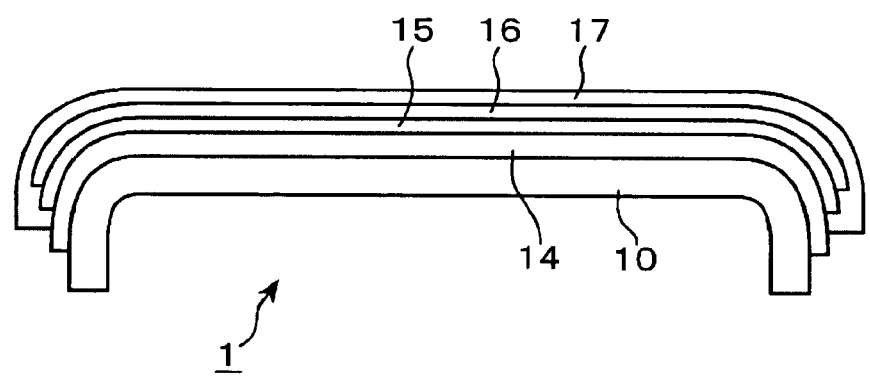
FIG.8
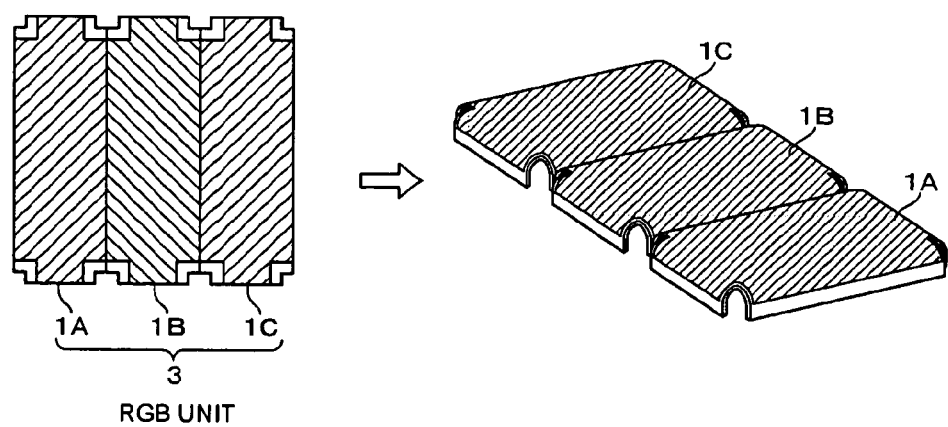

FIG.9  12 X 12 ARRANGEMENT (RGB UNITS)

1A 1B 1C
   3

FIG.10
(a)
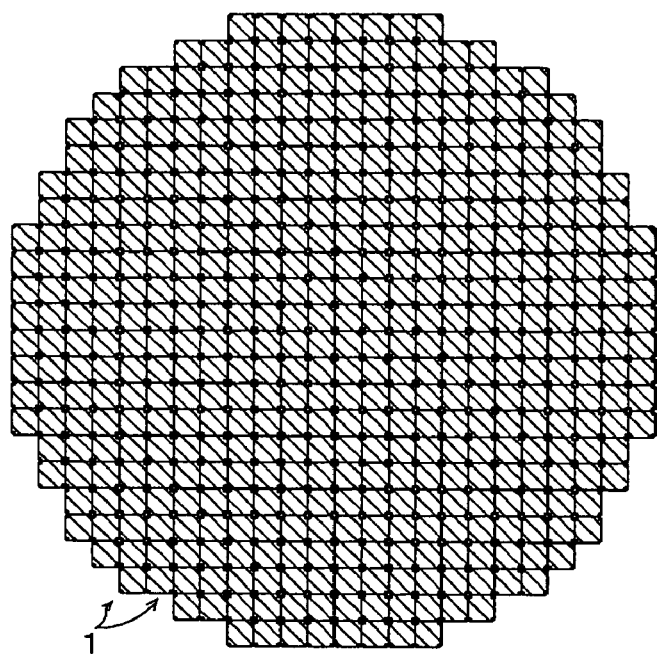
(b)
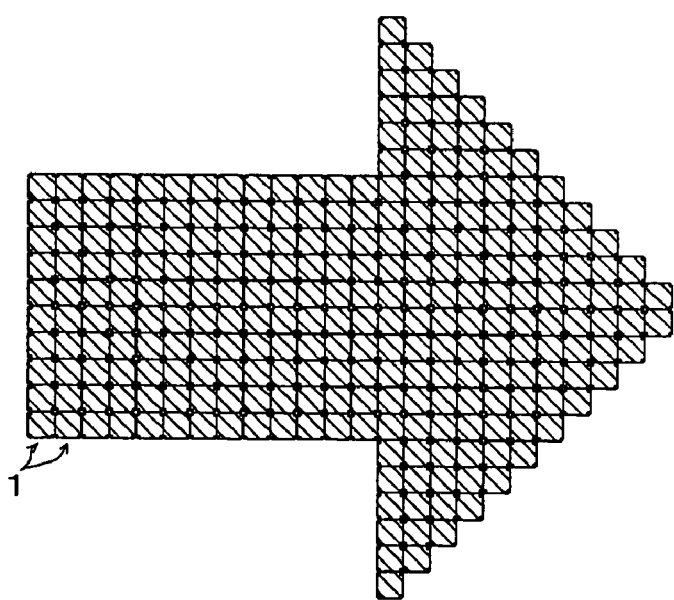

DIRECTION OF LIGHT EMISSION

LIGHT-EMITTING APPARATUS

BACKGROUND OF THE INVENTION (1) Field of the Invention

The present invention relates to a light-emitting apparatus in which a light-emitting region having a larger area is formed by arranging a plurality of light-emitting panel units each having a light-emitting portion.

(2) Description of Related Art

In recent years, light-emitting apparatuses such as display apparatuses and illumination apparatuses have been increasing in size. Particularly, with the progress of the development of organic EL elements, it is expected that light-emitting apparatuses for surface light sources will be realized as illumination and that large-size display light-emitting apparatuses will be realized which enable high image quality, wide viewing angles, and low-power driving.

In general, a light-emitting apparatus such as a display apparatus or the like is treated as a defective item if only a small defect is present in a light-emitting region. In a light-emitting apparatus such as an illumination apparatus or the like, a defect also affects the quality of the illumination apparatus. Thus, in manufacturing a large-size light-emitting apparatus, a large-area light-emitting region provided by arranging a plurality of light-emitting panels formed as units has the advantage that the apparatus can be manufactured with a higher yield over a large-area light-emitting region provided by using a single large-size light-emitting panel. On the other hand, when the large-area light-emitting region is provided by using a plurality of light-emitting panels formed as units and a non-light-emitting region is present at a joint between the light-emitting panels, the resulting non-light-emitting region extends in a mesh shape over the entire light-emitting region to present the problem of unnaturalness of a displayed image or illumination from a surface light source. Especially when the number of light-emitting panels formed as units is increased, leading of electrodes for supplying power or the like to a light-emitting portion is difficult, which contributes to a non-light-emitting region remaining in frames of light-emitting panel units.

A known method of making joints between light-emitting panel units unobtrusive is to adjust projected images optically. For example, Patent Document 1 has described a small-size display for a cellular phone in which a lens is placed on a lower surface of a screen to magnify light emitted by a light-emitting element to make joints unobtrusive. In addition, for example Patent Document 2 has described a display apparatus in which display panels are connected with transparent joints interposed therebetween and an image is displayed optically on the transparent joints. Each of the display apparatuses described in Patent Documents 1 and 2, however, has the problem of requiring an optical apparatus for displaying an image on the joints between the panels which results in a complicated apparatus structure and an increased manufacture cost with upsizing of a screen.

Another method of making joints unobtrusive is described, for example, in Patent Document 3 in which a flexible substrate having an extended portion serving as a non-display region formed on a side of a rectangular display region is used and the extended portion as the non-display region is bent and connected electrically to a printed back-face substrate. In addition, Patent Document 4 has described the use of a substrate similar to that in Patent Document 3, in which an extended portion serving as a non-light-emitting region is placed over a back-face side of an adjacent display panel. In the structures described in Patent Documents 3 and 4, however, a non-display region remains in joints.

Another method of making joints unobtrusive is to bend a display region to make joints more unobtrusive as described in Patent Document 5 and Patent Document 6. However, formation of a seal portion on a frame of a display panel as in Patent Document 6 increases the size of an interval between adjacent display portions and is not sufficient to make joints unobtrusive. When an end portion of one of adjacent panels is bent for connection as in Patent Document 5, a gap is produced between adjacent panels, and this approach is not sufficient to make joints unobtrusive. In addition, Patent Documents 5 and 6 have not described a connection structure of signal transmission lines for display and power supply lines, and thus it cannot be necessarily said that
Patent Document 5 or 6 provides an effective technique for connecting numerous display panels to form a large screen.

Patent Document 1: Japanese Patent Laid-Open No. 2001-350428

Patent Document 2: Japanese Patent Laid-Open No. 2002-520672

Patent Document 3: Japanese Patent Laid-Open No. 2005-242148

Patent Document 4: Japanese Patent Laid-Open No. 2005-123153

Patent Document 5: Japanese Patent Laid-Open No. 2002-297066

Patent Document 6: Japanese Patent Laid-Open No. 2001-057288

BRIEF SUMMARY OF THE INVENTION

Problems to be solved by the present invention include the abovementioned ones. It is thus an object of the present invention to provide a light-emitting apparatus in which light-emitting panel units can more reliably be connected with unobtrusive joints.

It is another object of the present invention to provide a light-emitting apparatus which has a relatively simple connection structure of wiring for providing power or signals to a display portion, by way of example. In other words, it is an object of the present invention to provide a light-emitting apparatus having a structure in which manufacture efficiency can be improved in forming a light-emitting region having a larger area by arranging numerous light-emitting panel units, by way of example.

MEANS FOR SOLVING THE PROBLEMS

According to an aspect, as described in claim 1, the present invention provides a light-emitting apparatus having a light-emitting region formed by arranging a plurality of light-emitting panel units, including each of the light-emitting panel units including a flexible substrate having a flat portion including an extended portion formed on each side of the flat portion, a light-emitting portion formed on one surface of the substrate to extend to the extended portion, and an electrode terminal formed at an end portion of the extended portion of the substrate, wherein the extended portion of the substrate is curved together with the light-emitting portion to connect both the curved light-emitting portions of the adjacent light-emitting panel units.

BRIEF DESCRIPTION OF DRAWINGS

FIG. 1 Schematic diagrams showing a light-emitting panel unit for used in a display apparatus according to Embodiment 1 of the present invention.

FIG. 2 Schematic diagrams showing how the light-emitting panel units are connected to form a large screen.

FIG. 3 A schematic diagram in vertical section showing a wiring substrate for holding the light-emitting panel units.

FIG. 7 Schematic diagrams in vertical section showing a light-emitting panel unit of top emission type.

FIG. 8 A schematic diagram showing an RGB unit for use in a display apparatus according to Embodiment 2 of the present invention.

FIG. 10 Diagrams schematically showing light-emitting regions of arbitrary shape formed of light-emitting panel units.

DESCRIPTION OF REFERENCE NUMERALS

Figure 4:
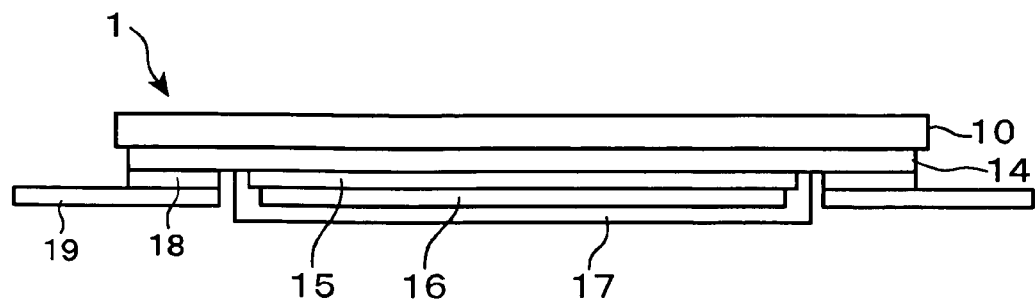
FIG. 4 A schematic diagram in vertical section showing another structure of an electrode terminal of the light-emitting panel unit.

1 LIGHT-EMITTING PANEL UNIT
10 SUBSTRATE
11 EXTENDED PORTION
12 LIGHT-EMITTING PORTION
13 END PORTION
14 ANODE
15 EL LAYER
16 CATHODE
17 SEAL FILM
2 WIRING SUBSTRATE
20 GUIDE MEMBER
22 SOCKET PORTION
24 INPUT/OUTPUT TERMINAL
3 RGB UNIT

DETAILED DESCRIPTION OF THE INVENTION

Preferred embodiments of the present invention in which a light-emitting apparatus according to the present invention is applied to a display apparatus will hereinafter be described in detail with reference to the accompanying drawings. However, the present invention is not limited to the embodiments described below.

Embodiment 1

First, an example of a light-emitting panel unit for use in the display apparatus according to the present invention will be described with reference to FIGS. 1 and 2. The following description is made with an example of a structure in which a single light-emitting panel unit corresponds to one pixel, but the present invention is not limited thereto, and a single light-emitting panel unit may constitute a plurality of pixels.

As shown in FIG. 1, a light-emitting panel unit 1 employed in Embodiment 1 includes a flexible substrate 10 having a flat portion which includes an extended portion formed on each side thereof. Preferably, the substrate 10 is of thin plate shape having the cross-shaped flat portion provided by cutting four corners into rectangular shape. However, the shape of the cutting is not limited to the rectangle and may be an arbitrary one. The substrate 10 is formed of a material having flexibility such as plastic. The extended portions 11 extending in cross directions can be curved in an arbitrary direction (for example, direction at 90 degrees). The "curved" refers to bending with such a curvature as to cause no breakage of the light-emitting panel unit such as cracking and peeling, and the curvature of the curved surface is not limited particularly. While FIG. 1 shows the flat portion formed in a generally square shape, Embodiment 1 is not limited thereto, and a rectangle, triangle, or polygon may be used as later described. When the substrate 10 is placed on the side where light is output as in Embodiment 1, a light-transmitting material is used for the substrate 10.

The substrate 10 may be a substrate having flexibility. For example, it is possible to use polyester such as polyethylene telephthalate, polyethylene naphthalate, and polybutylene telephthalate, cellulose resin such as triacetylcellulose and diacetylcellulose, and as polyethylene, polycarbonate, polyarylate, polysulphone, polyetersulphone, polyeterimide, polyimide, polyolephine, and acrylic resin such as polymethyl methacrylate. While the thickness of the substrate is not limited particularly, the substrate 10 having the smallest possible thickness is preferably used when the substrate 10 is placed on the side where light is output as in Embodiment 1. For example, the substrate 10 having a thickness of 1 mm or less is preferably used, and for making gaps more unobtrusive, the substrate 10 having a thickness of 0.2 mm or less is used. In a device structure of a top emission type or the like in which output light does not pass through the substrate 10, the thickness of the substrate 10 is not limited particularly.

A light-emitting portion 12 is formed on one surface of the substrate 10 such that the portion 12 extends to the extended portions in the cross directions. Specifically, the cross-shaped light-emitting portion 12 (diagonally shaded area in FIG. 1(a)) is formed on the back-face side of the substrate 10 except for end portions 13 of the extended portions 11. The light-emitting portion 12 may be formed by using a light-emitting element such as an organic electroluminescence (EL) element and an inorganic EL element. Among them, the organic EL element is preferably used in Embodiment 1 since it can be driven at a low voltage.

As shown in FIG. 1, the light-emitting portion 12 has a structure in which a light-transmitting anode 14 serving as a first electrode, an EL layer 15, and a cathode 16 serving as a second electrode are stacked in order over one surface of the substrate 10. A seal film 17 is formed to cover the EL layer 15 and the cathode 16 to seal the structure. The anode 14 is formed to extend to the end portions of a set of opposite extended portions 11 (extended portions in a horizontal direction of the sheet) out of the extended portions 11 in the cross directions, and the exposed portions at the end portions 13 function as anode terminals 14A. On the other hand, the cathode 16 is formed to extend to the end portions of the remaining set of opposite extended portions 11 (extended portions in a vertical direction of the sheet), and the exposed portions at the end portions 13 function as cathode terminals 16A. In other words, the light-emitting panel unit 1 of Embodiment 1 has the electrode terminals in the end portions 13 of the extended portions 11 in the cross directions. However, Embodiment 1 is not limited thereto, and the electrode terminals may be formed in any of the end portion 13 of the extended portions 11.

The anode 14 may be formed of a material having a high work function. For example, it is possible to use a metal oxide such as ITO (Indium Tin Oxide) and IZO (Indium Zinc Oxide), a metal such as Cr, Mo, Ni, Pt, and Au or a compound thereof, or an alloy containing any of them. The cathode 16 may be formed of a material having a low work function. For example, it is possible to use a metal such as Al, Ca, and Mg or a compound thereof, or an alloy containing any of them.

When the organic EL element is used, the EL layer 15 is formed of a multilayered film provided by stacking a hole injection layer, a hole transfer layer, a light-emitting layer, and an electron injection layer in order from the side of the anode 14, although not shown in FIG. 1. Each of the hole injection layer and the hole transfer layer may be formed of a material having excellent hole transfer properties, and by way of example, formed of a phthalocyanine compound such as copper phthalocyanine (Cu—Pc), or an arylamine compound such as NPB (N,N-di (naphthalene-1-yl)-N,N-diphenyl-benzidene). It is essential only that the organic light-emitting layer should have the function of producing the electroluminescence phenomenon. For example, the layer is formed of a fluorescent organic metal compound such as tris (8-hydroxyquinolinate) aluminum complex ($Alq_3$). The electron transfer layer is formed of a metal oxide such as lithium oxide ($Li_2O$), for example.

The seal film 17 is formed in a thin film shape by using, for example, an inorganic material such as silicon nitride (SiNx), silicon oxynitride (SiOxNy), aluminumoxide (AlOx), and aluminumnitride (AlNx), or an organic material having relatively low permeability to moisture such as polyparaxylylene.

A method of manufacture is described when the organic EL element is used as an example of the light-emitting portion 12. FIG. 1 shows the light-emitting panel unit 1 turned upside down after the light-emitting portion 12 is formed on an upper surface of the substrate 10. First, a conductive thin film of the anode material is deposited on the upper surface of the substrate 10 with evaporation, sputtering or the like. A mask is formed on an upper surface of the deposited conductive thin film with photolithography or the like. The conductive thin film is patterned with chemical etching or the like to form the anode 14.

Then, a plurality of thin films including the hole injection layer, the hole transfer layer, the light-emitting layer, and the electron injecting layer are stacked in order on an upper surface of the anode 14, for example with evaporation, to form the organic EL layer (EL layer 15). After the cathode 16 is formed with evaporation, the seal film 17 is deposited with plasma CVD or the like to seal the structure.

For providing a large screen by using the light-emitting panel unit 1 having the abovementioned structure, the extended portions 11 are curved, for example at 90 degrees, together with the light-emitting portion 12 as schematically shown in FIG. 2(a). In this case, the curved end portions of the substrate may be held to maintain the curved state naturally, the substrate may be bent while it is heated and then it may be cooled to maintain the curved state, or the curved state may be maintained by providing a guide component having a curvature for the curved portion. As schematically shown in FIG. 2(b), the light-emitting panel units 1 are placed such that the extended portions 11 of the adjacent substrates 10 are placed one on another, thereby connecting the light-emitting portions 12 of the adjacent light-emitting panel units. While FIG. 2(b) shows the light-emitting panel units 1 arranged in three rows and three columns, Embodiment 1 is not limited thereto, and the number of the arranged panel units 1 can be determined depending on the size of a display region to be manufactured.

A description is provided below of an example of a wiring substrate for holding the plurality of light-emitting panel units 1 connected in a matrix and supplying power or signals to each of the light-emitting panel units 1 with reference to FIG. 3.

Specifically, as shown in FIG. 3, the display apparatus of Embodiment 1 includes a wiring substrate 2 of flat-plate shape for holding a plurality of light-emitting panel units 1. A guide component 20 of flat-plate shape is also provided to contact upper surfaces of the light-emitting panel units 1 held on the wiring substrate 2. A side wall portion 21 may be provided in the form of a lid at end portions of the guide member 20 to seal the light-emitting panel units 1.

The wiring substrate 2 is provided with socket portions 22 each formed of a pair of standing walls 22a and 22b opposite to each other, as an example. The end portions 13 of the extended portions 11 of the substrates 10 curved at 90 degrees, by way of example, are fitted into and held by the socket portions 22. The extended portions 11 of the adjacent substrates 10 are placed one on another and fitted into one socked portion 22.

On a surface of or within the wiring substrate 2, wiring 23 is formed for a power supply line for supplying power to the light-emitting portions 12 and for a signal line for transmitting signals. Input/output terminals 24 of the wiring 23 are formed on inner surfaces of the socket portions 22. Thus, when the end portions 13 of the extended portions 11 of the substrates 10 curved at 90 degrees, by way of example, are inserted into the socket portions 22, electrical connection is made to the electrode terminals of the substrates 10 (anode terminals 14A and cathode terminals 16A). The wiring 23 is preferably made of a material having the lowest possible resistance, and specifically, a metal having low resistance is preferably used such as copper, silver, gold, and aluminum. The wiring 23 may be formed by patterning a conductive material onto the wiring substrate 2 with printing or the like, but Embodiment 1 is not limited thereto particularly.

As shown in FIG. 4, as a method for making the connection more reliably, an anisotropic conductive film (ACF) 18 or the like may be used to connect a flexible printed cable (FPC) 19 to a surface of the electrode terminal (anode terminal 14A, cathode terminal 16A) of the substrate 10 to form an extraction electrode portion formed of the electrode terminal, the ACF 18, and the FPC 19 such that the extraction electrode portion is connected to the input/output terminal 24 of the socket portion 22.

The guide component 20 may be formed of a light-transmitting material, and for example, it is possible to use a flat plate made of glass or light-transmitting plastic. The guide component 20 preferably presses the upper surfaces of the light-emitting panels 1 slightly. This allows the flatness of the central portion of the light-emitting region to be ensured even when the extended portions 11 are curved.

Figure 5:
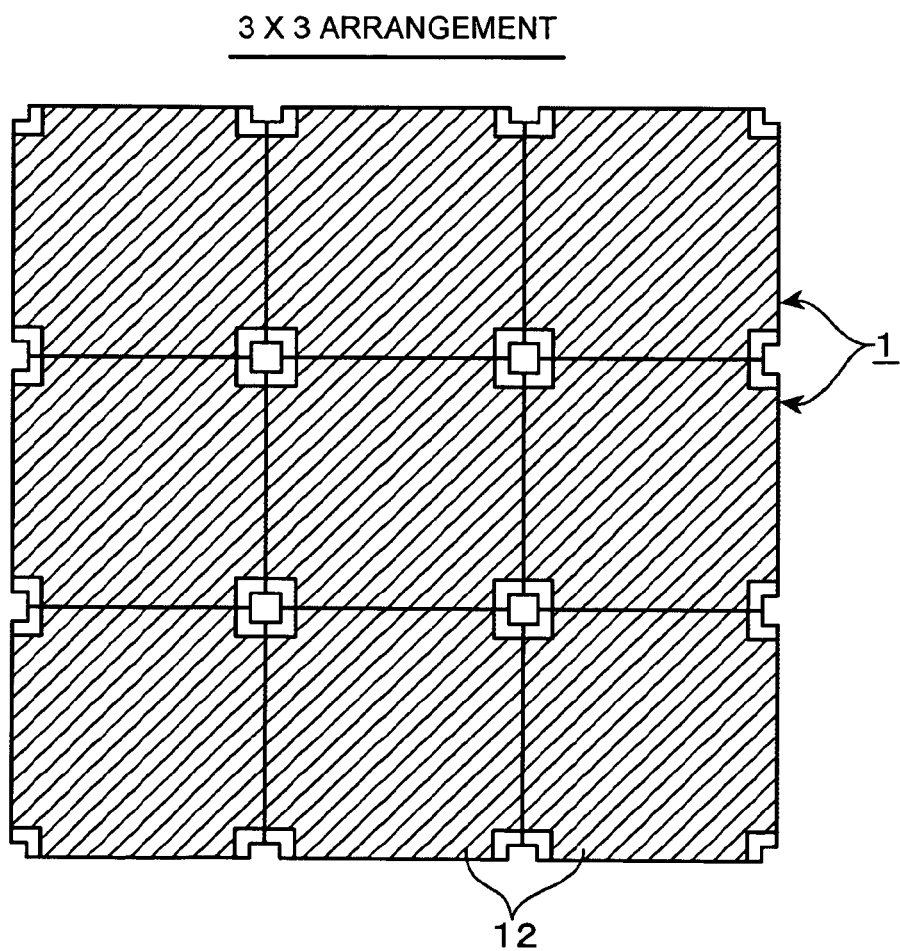
FIG. 5 A diagram schematically showing a light-emitting region formed of light-emitting panel units in three rows and three columns.
Figure 6:
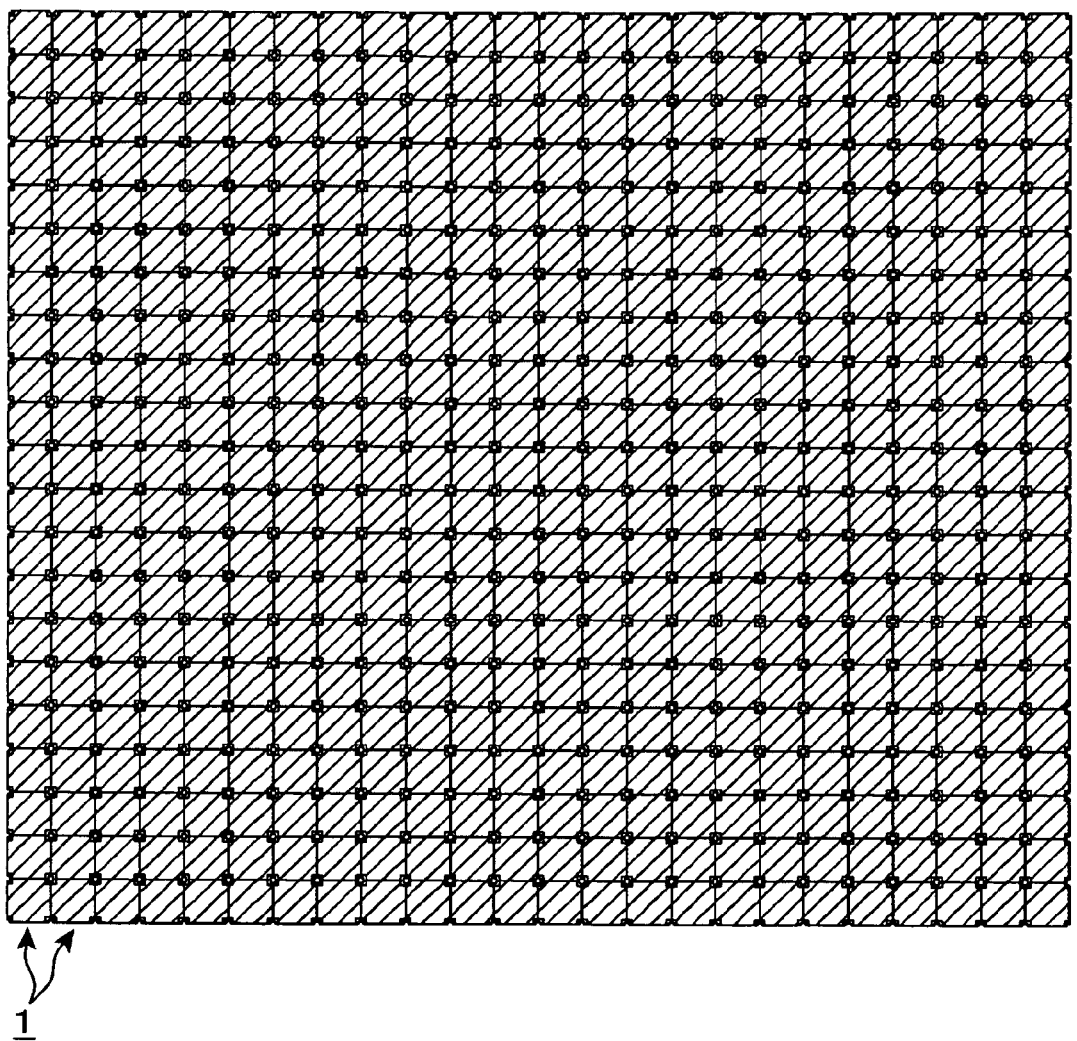
FIG. 6 A diagram schematically showing a light-emitting region formed of light-emitting panel units in 24 rows and 24 columns.

According to the display apparatus of Embodiment 1, the light-emitting portion 12 is formed to extend to the extended portions 11 in the cross directions on one surface of the flexible substrate 10 having the cross shape with the cut four corners, the extended portions are curved, for example at 90 degrees, together with the light-emitting portion 12, and in this state, the light-emitting panel units 1 are connected. Since the curved light-emitting portions 12 of the adjacent light-emitting panel units 1 are connected, the large-size display apparatus can be realized with their joints unobtrusive more reliably as schematically shown in FIGS. 5 and 6. In addition, since no optical apparatus as described in Patent Document 1 or 2 is required, the light-emitting panel can be reduced in thickness. The apparatus structure can be simplified and reduced in weight.

According to the display apparatus of Embodiment 1, the light-emitting panel units 1 can be connected relatively easily only by inserting the end portions 13 of the extended portions 11, for example curved at 90 degrees, into the socket portions 22 of the wiring substrate 2, and the electrical connection can be made simultaneously. This can improve the manufacture efficiency in providing the large screen by using numerous light-emitting panel units.

When the extended portions 11 are curved, the curvature may be significantly large to produce unnatural images depending on the material of the substrate 10. A possible countermeasure is to provide a correction apparatus such as an image correction circuit to correct images by software. A possible correcting method by hardware is to form a larger pixel at a curved position such that the pixel appears to be the same as the pixels at the other positions when the light-emitting region is viewed from the front, or to embed a light-transmitting member having substantially the same refractive index as that of the substrate 10 into the gap at the curved position to perform correction.

While Embodiment 1 has shown the example of the structure of the bottom emission type in which the light-emitting portion 12 is formed on the back-face side of the substrate 10, Embodiment 1 is not limited thereto. As shown in FIG. 7, it goes without saying that a structure of a top emission type may be used in which the light-emitting portion 12 is formed on a top-face side of the substrate 10. The top emission type has the advantage that joints can be made unobtrusive more reliably since the thickness of the seal film 17 or the thickness of the extraction electrode portion including the ACF 18 and the FPC 19 substantially corresponds to the gap between the adjacent light-emitting portions 12.

Embodiment 2

Next, a display apparatus according to Embodiment 2 of the present invention will be described with reference to the accompanying drawings. The display apparatus of Embodiment 2 has the same structure as that in Embodiment 1 described above except that an RGB unit is formed by connecting three light-emitting panel units having light-emitting portions which emit light of red (R), green (G), and blue (B), respectively, and that numerous RGB units are arranged in a matrix to provide a large screen.

Figure 9:
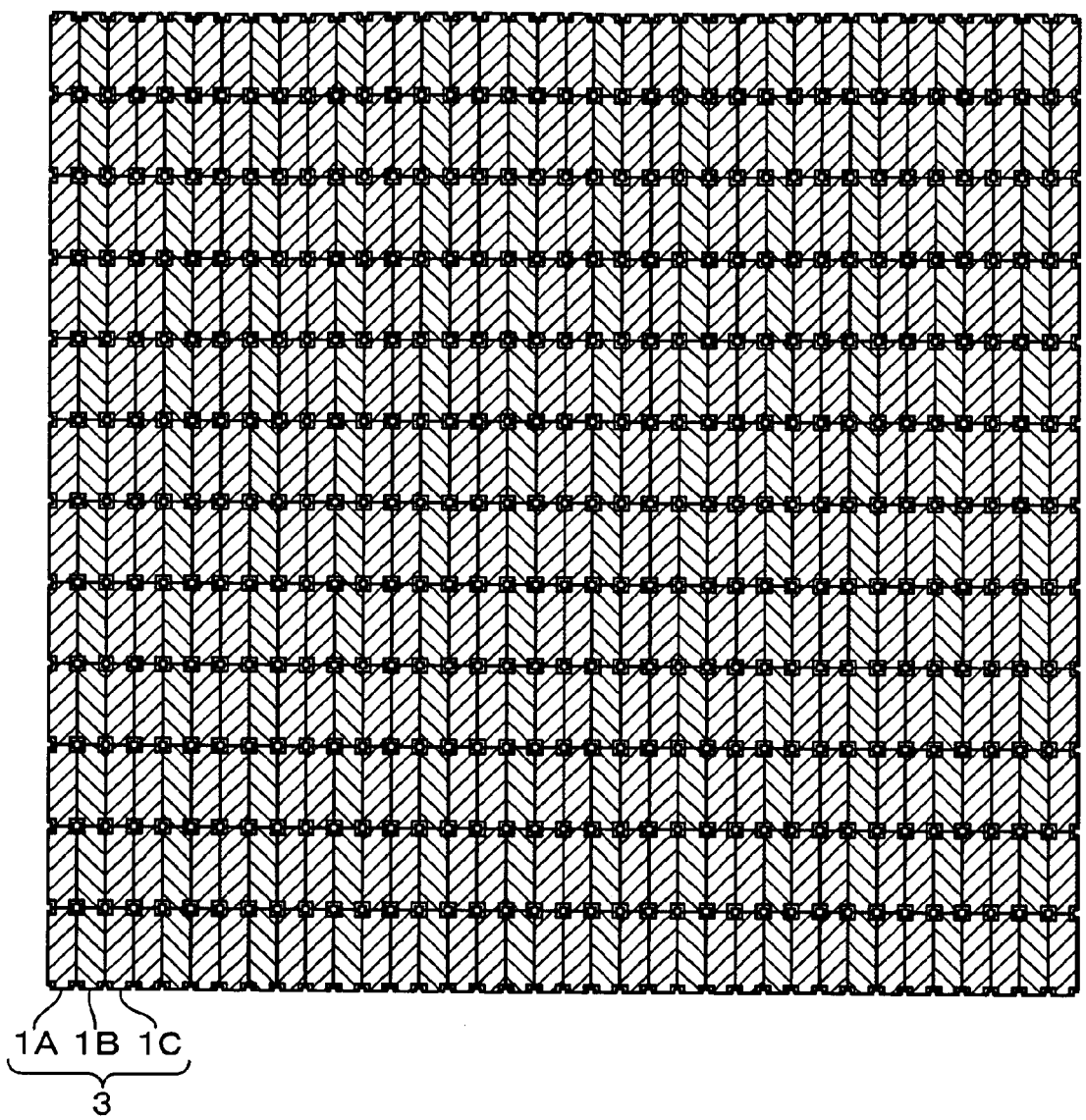
FIG. 9 A diagram schematically showing a light-emitting region formed of RGB units in 12 rows and 12 columns.

As shown in FIG. 8, in the display apparatus of Embodiment 2, an RGB unit 3 is constituted by connecting three light-emitting panel units 1A, 1B, and 1C which have light-emitting portions emitting light of red (R), green (G), and blue (B), respectively. The panel unit can be manufactured in the same manner as that in the light-emitting panel unit 1 of Embodiment 1 described above except that each of the light-emitting panel units 1A, 1B, and 1C has a smaller width. Light emission of red (R), green (G), and blue (B) is realized by changing the material of an EL layer 15. Numerous RGB units 3 are connected in a matrix to provide the large screen capable of display in full color. FIG. 9 is a schematic diagram showing an example in which the RGB units 3 are arranged in 12 rows and 12 columns to provide a large screen. Since extended portions are curved, for example at 90 degrees, together with a display portion to connect the light-emitting panel units 1A, 1B, and 1C in Embodiment 2, the adjacent light-emitting panel units, or the curved light-emitting portions of the adjacent RGB units 3 can be connected to provide unobtrusive joints reliably similarly to Embodiment 1 described above.

As described above, each of the display apparatuses according to Embodiments 1 and 2 includes the light-emitting panel unit including the flexible substrate having the flat portion of cross shape provided by cutting four corners, the light-emitting portion formed on one surface of the substrate to extend to the portions extending in the cross directions, and the electrode terminal formed at the end portion of the extended portion of the substrate, wherein the portions of the substrate extending in the cross directions are curved, for example at 90 degrees, to connect the light-emitting portions of the adjacent light-emitting panel units, thereby allowing the joints between the light-emitting panel units to be made unobtrusive more reliably. In addition, it is possible to use the relatively simple connection structure of the wiring for providing power or signals to the display portion, and thus the manufacture efficiency can be improved in forming the large screen by arranging numerous light-emitting panel units.

Embodiment 3

Next, a light-emitting apparatus according to Embodiment 3 of the present invention will be described with reference to the accompanying drawings. An illumination apparatus of Embodiment 3 has the same structure as that in Embodiment 1 described above except that a plurality of light-emitting panel units 1 each having a light-emitting portion 12 which emits light are connected to form a light-emitting region of single color and are arranged in an arbitrary shape to provide a large screen.

The light-emitting operation of the light-emitting panel units 1 can be performed such that all of the light-emitting panel units 1 can be turned on or off at the same time by controlling power or signals supplied through wiring 23 on a wiring substrate 2. Dynamic display can be performed by regularly controlling the order in which the light-emitting panel units 1 are turned on or off.

An illumination apparatus having an arbitrary shape, not limited to a rectangle, can be formed by arbitrarily changing the orientation or the number of connected light-emitting panel units 1. FIG. 10 shows specific examples in which the light-emitting panel units 1 are connected to form light emitters of circular shape and arrow shape, but the shape is not limited thereto. It is essential only that the light-emitting panel units 1 should be connected adjacently in any direction, and the light-emitting apparatus may be formed in an arbitrary shape.

Figure 11:
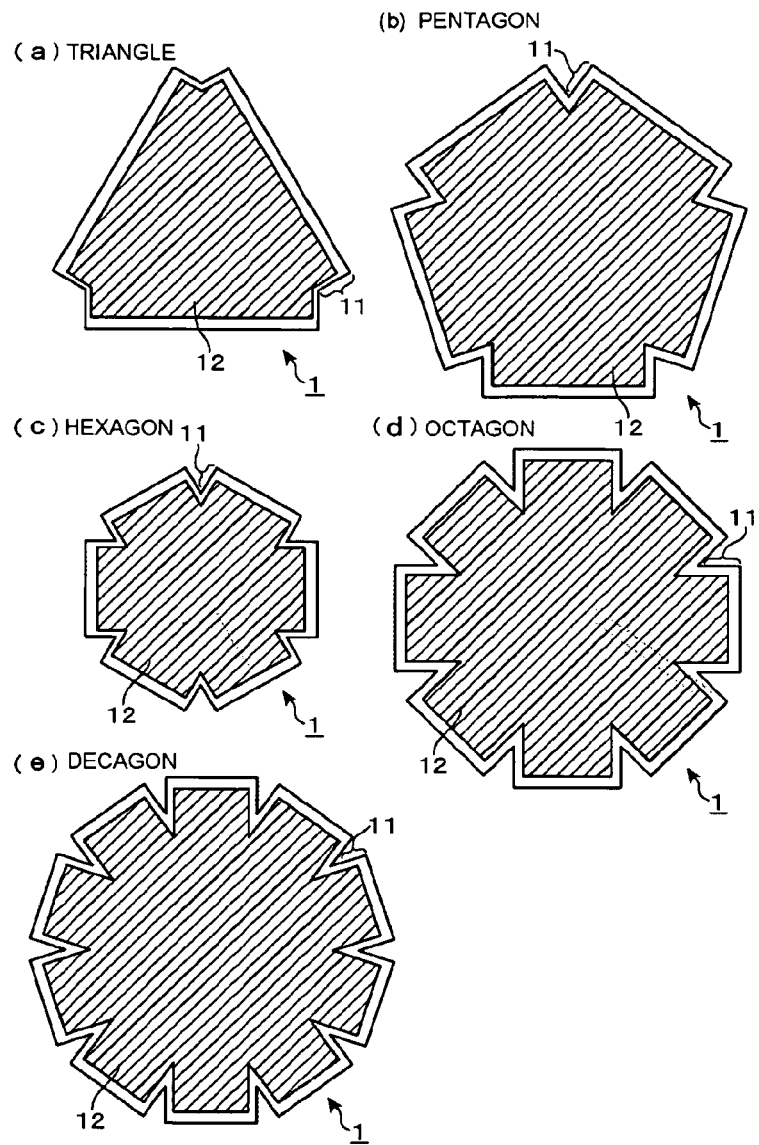
FIG. 11 Diagrams schematically showing modification examples of the light-emitting panel unit.

As a method for forming the light-emitting apparatus in an arbitrary shape, the shape of the light-emitting panel unit 1 itself can be changed instead of the box shape shown in FIGS. 2 and 8 (square and rectangle). Specifically, it is possible to use a substrate 10 of polygonal shape in which each corner is cut, an extended portion 11 is formed at each side, and a light-emitting portion 12 is formed to extend to the extended portions 11. FIG. 11 shows substrates 10 of triangular shape, pentagonal shape, hexagonal shape, octagonal shape, and decagonal shape as preferable examples. The change of the substrate 10 itself allows formation of a light-emitting region of more various shapes. While FIG. 11 shows the substrate 10 of regular polygon having equal side lengths as the preferable examples, a polygon may have different side lengths. The shape of the cutting is not limited to shapes shown, and an arbitrary shape may be used. The length and the width of the extended portions 11 may be adjusted as appropriate.

Since the extended portions 11 are curved, for example at 90 degrees, together with the display portion 12 to connect the light-emitting panel units 1 in Embodiment 3, the curved light-emitting portions 12 of the adjacent light-emitting panel units 1 can be connected to make joints unobtrusive reliably similarly to Embodiments 1 and 2 described above.

In Embodiments 1 to 3 described above, the extended portions 11 of the substrate 1 are curved at 90 degrees. In the present invention, however, the bending direction is not limited to 90 degrees, and bending may be performed in an arbitrary direction. In the following, description will be made of an embodiment in which the extended portions 11 are curved in a direction other than 90 degrees.

Embodiment 4

Figure 12:
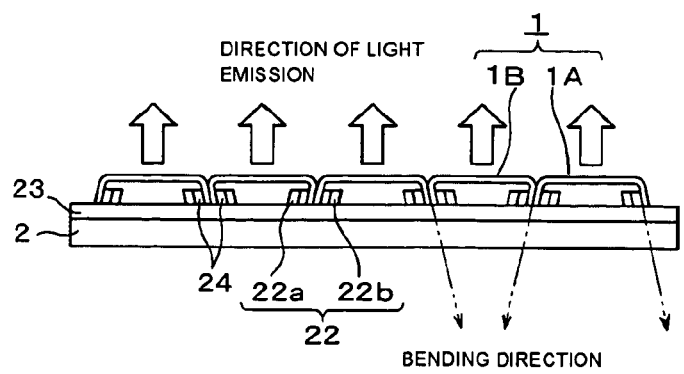
FIG. 12 A section view showing a light-emitting apparatus according to Embodiment 4 of the present invention.

FIG. 12 shows an embodiment in which the light-emitting panel unit shown in FIG. 2(a) is used and mounted on the wiring substrate 2 by curving the extended portions 11 of the substrates 10 at angles other than 90 degrees. More specifically, a light-emitting panel unit 1A in which extended portions 11 are bent at an obtuse angle larger than 90 degrees and a light-emitting panel unit 1B in which extended portions 11 are bent at an acute angle smaller than 90 degrees are alternately placed to connect light-emitting portions 12 of the adjacent light-emitting panel units 1. A socket portion 22 is inclined to fit to the bent extended portions 11. However, the angle is not limited in any way but may be set arbitrarily. Embodiment 4 can achieve the same effects as those in Embodiments 1 to 3 described above. While FIG. 12 shows a modification example of the structure of Embodiment 1 shown in FIG. 3, the extended portions 11 may be bent at an arbitrary angle similarly in the other embodiments described above.

In the present invention, the light-emitting region formed by connecting the plurality of light-emitting panel units 1 is not limited to the flat surface, and an arbitrary surface can be formed such as a curved surface including a circumferential shape, a fan shape and a spherical shape, and a polyhedron shape.

Embodiment 5

Figure 13:
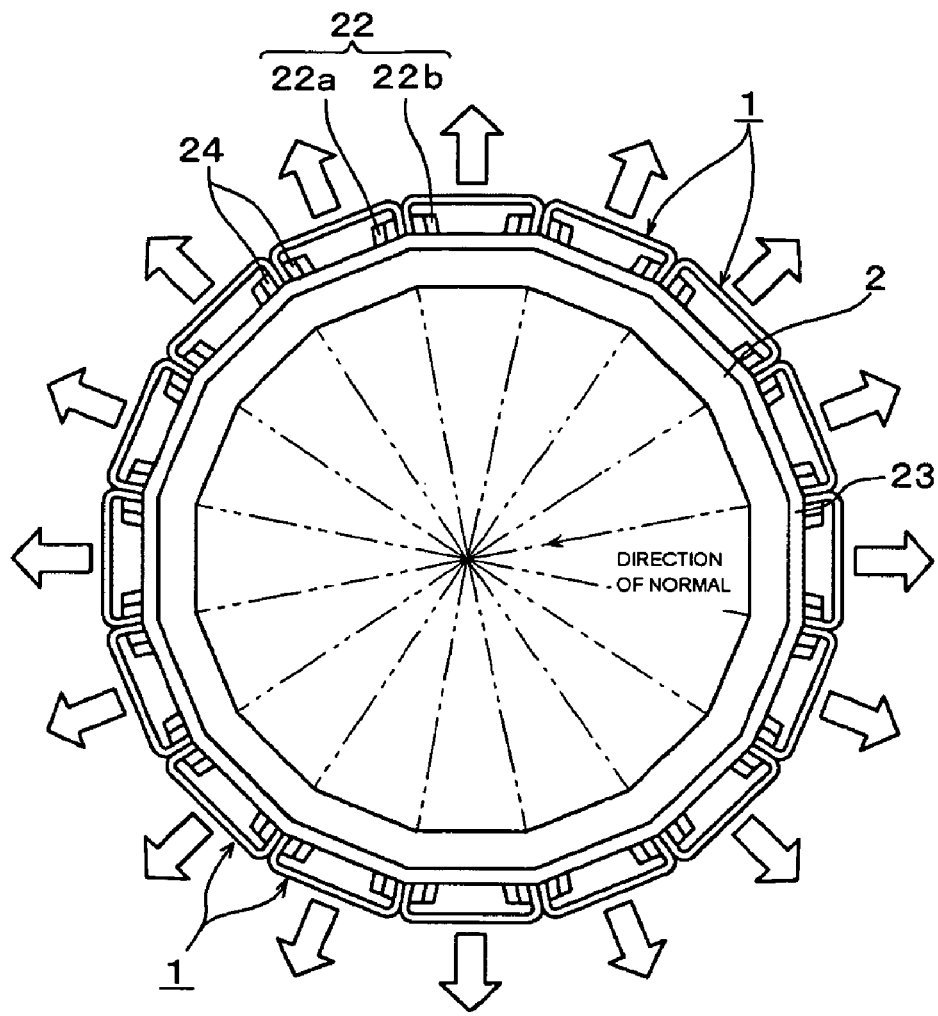
FIG. 13 A section view showing a light-emitting apparatus according to Embodiment 5 of the present invention.

As an example, FIG. 13 schematically shows an embodiment 5 in which the light-emitting panel unit 1 shown in FIG. 2(a) is used to form a light-emitting region which has a circumferential shape and emits light outward. More specifically, for example on a wiring substrate 2 having a cross section of generally cylindrical shape, light-emitting panel units 1 including extended portions 11 bent in the direction of the normal to an external circle of the cylindrical shape (bent at an acute angle smaller than 90 degrees in this case) are mounted to connect light-emitting portions of the adjacent light-emitting panel units 1. While FIG. 13 shows an example of a structure in which 16 light-emitting panel units 1 are connected around the circumference, the number of light-emitting panel units 1 is not limited thereto, and an arbitrary number of units can be used. In addition, the light-emitting panel units 1 arranged around the circumference may be placed vertically (in a perpendicular direction to the sheet). Embodiment 5 can achieve the same effects as those in Embodiments 1 to 4 described above. Furthermore, the structure in Embodiment 5 has the advantage that a light-emitting apparatus can be formed in an arbitrary shape three-dimensionally.

Embodiment 6

Figure 14:
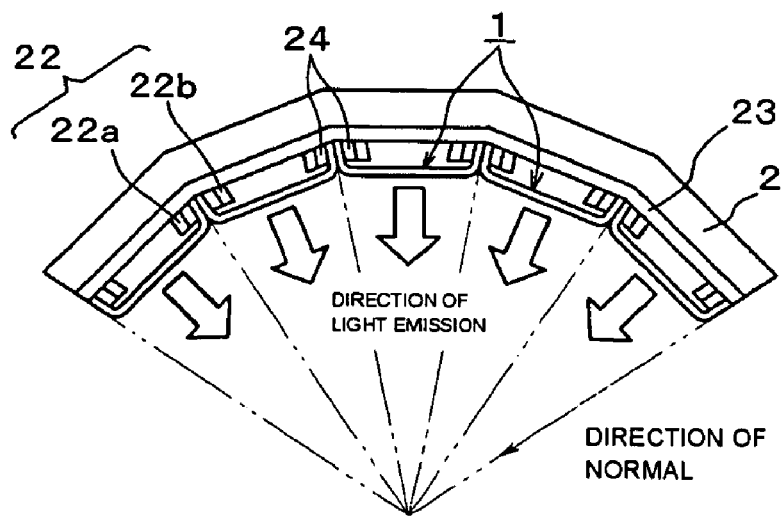
FIG. 14 A section view showing a light-emitting apparatus according to Embodiment 6 of the present invention.

As a modification example of Embodiment 5, it is possible to form a light-emitting region which has a fan shape and emits light inward as schematically shown in FIG. 14, for example. More specifically, on a wiring substrate 2 having a cross section of generally fan shape, light-emitting panel units 1 including extended portions 11 bent in the direction of the normal to an external arc of the fan shape (bent at an obtuse angle larger than 90 degrees in this case) are mounted to connect light-emitting portions of the adjacent light-emitting panel units 1. The number of light-emitting panel units 1 is not limited thereto in Embodiment 6, and an arbitrary number of units can be used. In addition, the light-emitting panel units 1 arranged in the fan shape may be placed vertically (in a perpendicular direction to the sheet). While FIG. 14 shows a structure in which light is emitted inward, it is possible to form a structure in which light is emitted outward or to emit light both inward and outward. Embodiment 6 can achieve the same effects as those in Embodiments 1 to 5 described above. Furthermore, the structure in Embodiment 6 has the advantage that a light-emitting apparatus can be formed in an arbitrary shape three-dimensionally.

Embodiment 7

Figure 15:
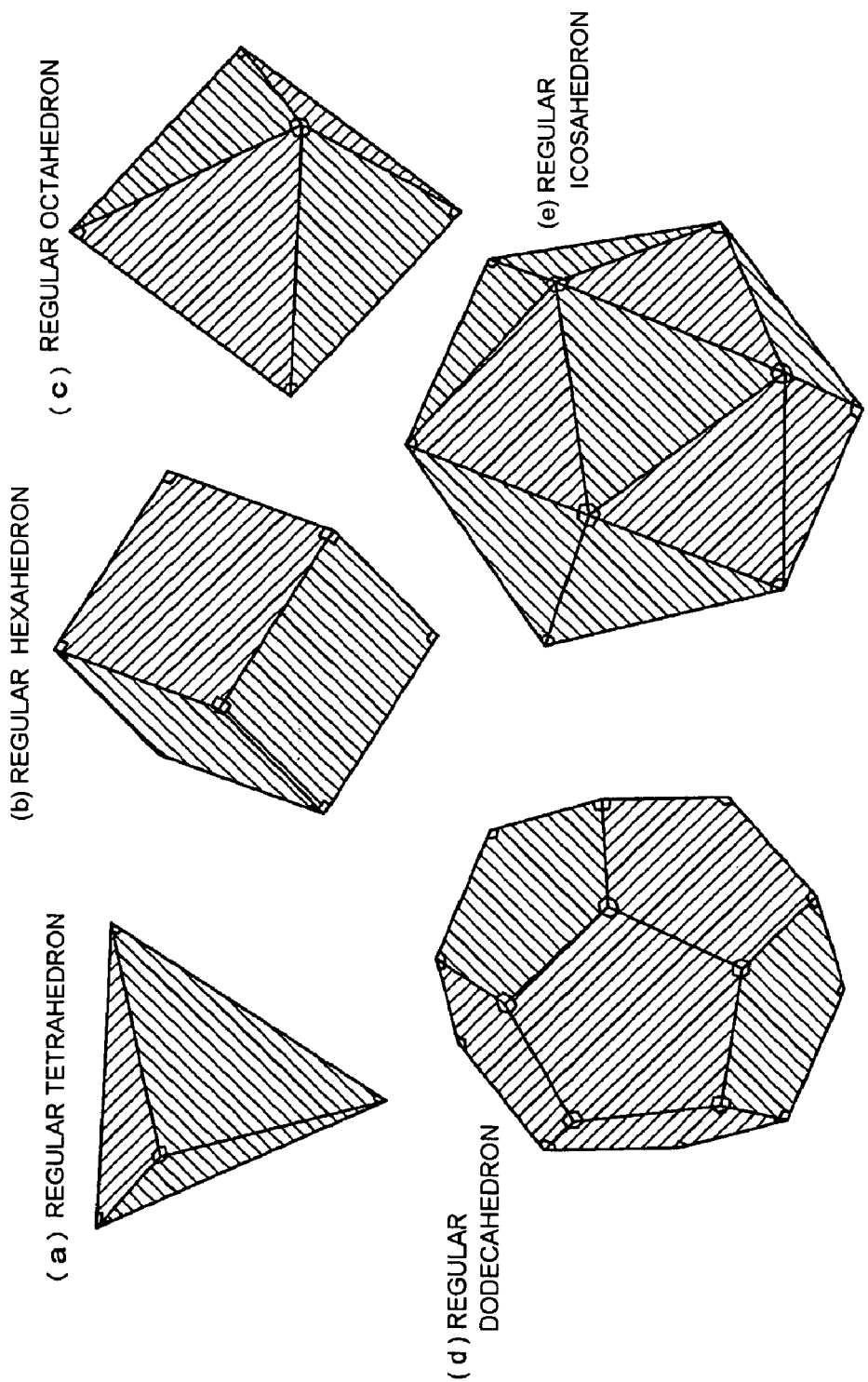
FIG. 15 Diagrams showing light-emitting apparatuses according to Embodiment 7 of the present invention.

As an embodiment in which a polyhedron light-emitting region is formed, regular polyhedrons can be used as schematically shown in FIG. 15, including a regular tetrahedron, a regular hexahedron, a regular octahedron, a regular dodecahedron, and a regular icosahedron. The light-emitting region of such regular polyhedron can be formed by using the light-emitting panel units 1 of regular triangle, square, and regular pentagon shown as the preferable examples in FIGS. 2 and 11, for example. In this case, one surface of the regular polyhedron may be formed of a single light-emitting panel unit or of a combination of a plurality of light-emitting panel units 1. In this manner, in the light-emitting panel unit 1 according to the embodiments of the present invention, the extended portions 11 of the substrate 10 are curved together with the light-emitting portion, and the light-emitting portions of the adjacent light-emitting panel units 1 are connected, thereby readily enabling formation of the light-emitting region of not only the flat surface and the curved surface but also of the three-dimensional shape.

Embodiment 8

As a modification example of Embodiment 7, a light-emitting region of semi-regular polyhedron can be formed instead of regular polyhedron. Specific examples of the semi-regular polyhedron may include a truncated tetrahedron, a truncated hexahedron, a truncated octahedron, a truncated dodecahedron, a truncated icosahedron, a cuboctahedron, an icosidodecahedron, a rhombicuboctahedron, a rhombicosidodecahedron, a rhombitruncated cuboctahedron, a rhombitruncated icosidodecahedron, a snub cube, and a snub dodecahedron. The light-emitting region of such complicated shape can be easily formed by using the light-emitting panel units 1 of regular triangle, square, regular pentagon, regular hexagon, regular octagon, and regular decagon shown as the preferable examples in FIGS. 2 and 11, for example.

As described above, each of the light-emitting apparatuses according to the present invention includes the light-emitting panel unit including the flexible substrate having the flat portion including the extended portion formed on each side thereof, the light-emitting portion formed on one surface of the substrate to extend to the extended portion, and the electrode terminal formed at the end portion of the extended portion of the substrate, wherein the extended portion of the substrate is curved together with the light-emitting portion to connect the light-emitting portions of the adjacent light-emitting panel units, thereby allowing the joints between the light-emitting panel units to be unobtrusive. In addition, it is possible to use the relatively simple connection structure of the wiring for providing power or signals to the display portion, and thus the manufacture efficiency can be improved in manufacturing the large-area light-emitting apparatus by arranging numerous light-emitting panel units.

The invention claimed is:

1. A light-emitting apparatus comprising:
a light-emitting region formed by a plurality of light-emitting panel units;
wherein each of the light-emitting panel units includes
(i) a flexible substrate having a flat portion including an extended portion formed on each side of the flat portion,
(ii) a light-emitting portion formed on one surface of the substrate and extending onto the extended portion, and
(iii) an electrode terminal formed at an end portion of the extended portion of the substrate,
wherein the extended portions of the substrate of each light-emitting panel unit is curved together with the light-emitting portion, and
wherein the light emitting portions of adjacent light emitting panel units are connected to each other.

2. The light-emitting apparatus according to claim 1, wherein the flat portion of each substrate has a cross shape with the extended portions being constituted by arms of the cross shape, and the light emitting portion extends onto the onto the arms of the cross shape.

3. The light-emitting apparatus according to claim 1, wherein the flat portion of each substrate has a polygonal shape.

4. The light-emitting apparatus according to claim 3, wherein the polygonal shape is one of a triangle, a pentagon, a hexagon, an octagon, and a decagon.

5. The light-emitting apparatus according to claim 1, further comprising a wiring substrate, a plurality of socket portions being provided on one surface of the wiring substrate, the end portion of the curved extended portion of the substrate being fitted into the socket portion.

6. The light-emitting apparatus according to claim 5, wherein an input/output terminal for power supply wiring and signal transmission wiring is formed on an inner surface of the socket portion and is connected to the electrode terminal of the substrate.

7. The light-emitting apparatus according to claim 5, wherein the curved extended portions of the adjacent substrates are placed one on another and fitted into the socket portion.

8. The light-emitting apparatus according to claim 1, wherein the light-emitting portion is formed of an organic EL element formed on the substrate, and an anode and a cathode of the organic EL element extend to the end portion of the extended portion of the substrate to provide the electrode terminal.

9. The light-emitting apparatus according to claim 8, wherein the flat portion of each substrate has a cross shape with the extended portions being constituted by arms of the cross shape, and the light emitting portion extends onto the onto the arms of the cross shape, and wherein the anode terminal is formed on a set of the extended portions opposite to each other, and the cathode terminal is formed on the remaining set of the opposite extended portions.

10. The light-emitting apparatus according to claim 1, wherein the light-emitting panel unit has a structure of a top emission type, and the light-emitting portion is formed on an upper surface of the substrate.

11. The light-emitting apparatus according to claim 1, wherein the light-emitting apparatus is a display apparatus, and each light-emitting panel unit constitutes a pixel.

12. The light-emitting apparatus according to claim 1, wherein the light-emitting apparatus is a display apparatus,
wherein the display apparatus includes a plurality of RGB units, and each RGB unit is provided by connecting three of the light-emitting panel units having the light-emitting portions which emit light of red (R), green (G), and blue (B), respectively, and
wherein the plurality of RGB units are connected to form a full-color display screen.

13. The light-emitting apparatus according to claim 1, wherein the light-emitting apparatus is an illumination apparatus, and the light-emitting portions of the light-emitting panel units emit light of the same color.

14. The light-emitting apparatus according to claim 13, wherein the light-emitting portions of the light-emitting panel units have a function of turning on or off at the same time.

15. The light-emitting apparatus according to claim 1, wherein the light-emitting region formed by arranging the plurality of light-emitting panel units is formed in a curved surface.

16. The light-emitting apparatus according to claim 1, wherein the light-emitting region formed by arranging the plurality of light-emitting panel units is formed in a polyhedron.

17. A light-emitting apparatus comprising:
a light-emitting region formed by a plurality of light-emitting panel units;
wherein each of the light-emitting panel units includes
(i) a flexible substrate having a flat portion including an extended portion formed on each side of the flat portion,
(ii) a light-emitting portion formed on one surface of the substrate and extending onto the extended portion, and
(iii) an electrode terminal formed at an end portion of the extended portion of the substrate,
wherein the extended portions of the substrate of each light-emitting panel unit have bent portions extending at an angle relative to the flat portion of the substrate,
wherein the light-emitting portion of each light-emitting panel extends onto the bent portion of the extended portions of the respective substrate, and
wherein the flat portions of the substrates are arranged in a common plane, and the bent portion of the extended portions of each substrate directly contact extended portions of adjacent substrates.

18. The light-emitting apparatus according to claim 17, wherein the flat portion of each substrate has a cross shape with the extended portions being constituted by arms of the cross shape, and the light emitting portion extends onto the onto the arms of the cross shape.

* * * * *